United States Patent
Wu

(10) Patent No.: US 8,723,583 B2
(45) Date of Patent: May 13, 2014

(54) INTERFACE CIRCUIT

(71) Applicant: Novatek Microelectronics Corp., Hsinchu (TW)

(72) Inventor: Tse-Hung Wu, New Taipei (TW)

(73) Assignee: Novatek Microelectronics Corp., Hsinchu (TW)

(*) Notice: Subject to any disclaimer, the term of this patent is extended or adjusted under 35 U.S.C. 154(b) by 0 days.

(21) Appl. No.: 13/786,561

(22) Filed: Mar. 6, 2013

(65) Prior Publication Data

US 2014/0077861 A1 Mar. 20, 2014

(30) Foreign Application Priority Data

Sep. 19, 2012 (TW) .............................. 101134246 A

(51) Int. Cl.
*H03L 5/00* (2006.01)

(52) U.S. Cl.
USPC .............. 327/333; 327/307; 326/30; 330/258

(58) Field of Classification Search
USPC ...................... 327/307, 333; 326/30; 330/258
See application file for complete search history.

(56) References Cited

U.S. PATENT DOCUMENTS

| 6,445,331 | B1 * | 9/2002 | Stegers | 341/172 |
| 7,358,801 | B2 * | 4/2008 | Perdoor et al. | 330/9 |
| 7,714,607 | B2 * | 5/2010 | Nakajima | 326/30 |

* cited by examiner

*Primary Examiner* — Kenneth B. Wells
(74) *Attorney, Agent, or Firm* — Rabin & Berdo, P.C.

(57) ABSTRACT

An interface circuit includes a receiver, a first terminal resistor, a second terminal resistor, a switch circuit and a switch control circuit. The receiver has a first channel and a second channel. The first channel receives a first channel voltage, and the second channel receives a second channel voltage. According to the first channel voltage and the second channel voltage, the switch control circuit controls the switch circuit to discharge a common mode capacitor before the first terminal resistor or the second terminal resistor couple to the common mode capacitor.

11 Claims, 6 Drawing Sheets

INTERFACE CIRCUIT

This application claims the benefit of Taiwan application Serial No. 101134246, filed Sep. 19, 2012, the subject matter of which is incorporated herein by reference.

BACKGROUND OF THE INVENTION

1. Field of the Invention

The invention relates in general to a circuit, and more particularly to an interface circuit.

2. Description of the Related Art

FIG. 1 shows a schematic diagram of a conventional interface circuit; FIG. 2 shows a timing diagram of associated signals in the conventional interface circuit. Referring to FIGS. 1 and 2, a conventional interface circuit 1 includes a receiver 11, a common mode capacitor $C_{com}$, a terminal resistor R1, a terminal resistor R2, a switch SW1 and a switch SW2. The receiver 11 has a channel ch1 and a channel ch2. The switches SW1 and SW2 are respectively controlled by switch control signals $S_{SW1}$ and $S_{SW2}$ to couple the terminal resistors R1 and R2 to the common mode capacitor $C_{com}$. At the instant when the switches SW1 and SW2 are turned on, noises $\Delta V1$ and $\Delta V2$ are produced at the channels ch1 and ch2 due to instantaneous discharge of the common mode capacitor $C_{com}$.

SUMMARY OF THE INVENTION

The invention is directed to an interface circuit for suppressing channel noises to further prevent a misinterpretation of a receiver.

According to an aspect of the present invention, an interface circuit is provided. The interface circuit includes a receiver, a first terminal resistor, a second terminal resistor, a switch circuit and a switch control circuit. The receiver has a first channel and a second channel. The first channel receives a first channel voltage, and the second channel receives a second channel voltage. According to the first channel voltage and the second channel voltage, the switch control circuit controls the switch circuit to discharge a common mode capacitor before the first terminal resistor or the second terminal resistor couples to the common mode capacitor.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 1:
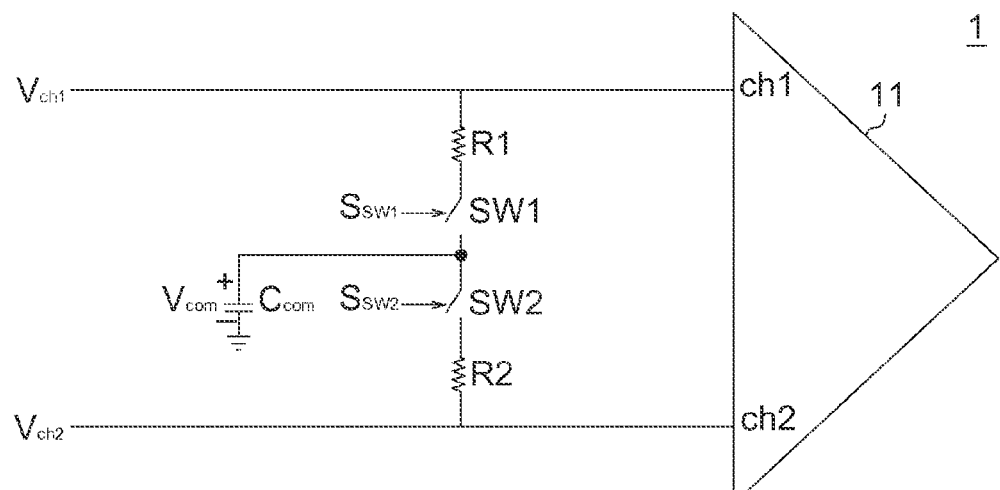
FIG. 1 is a schematic diagram of a conventional interface circuit.
Figure 2:
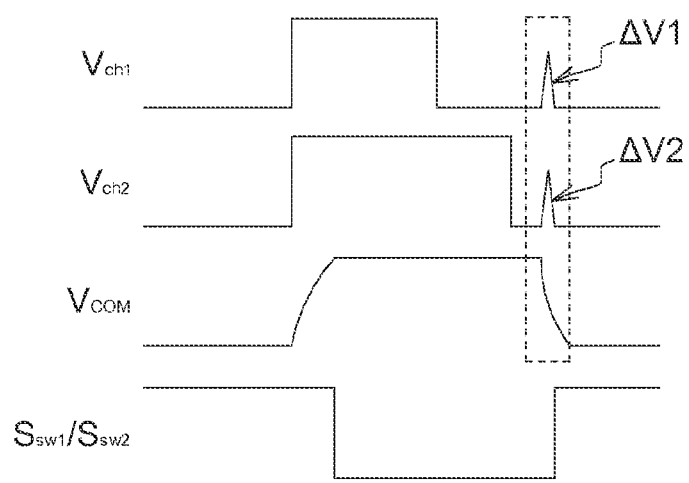
FIG. 2 is a timing diagram of associated signals in a conventional interface circuit.
Figure 3:
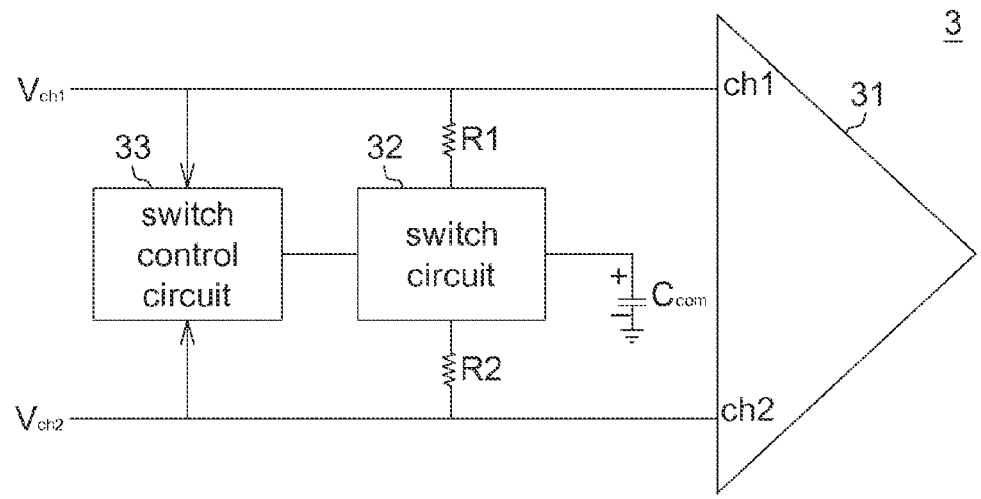
FIG. 3 is a schematic diagram of an interface circuit according to one embodiment.

FIG. 3 shows a schematic diagram of an interface circuit according to one embodiment. An interface circuit 3 is operable under a large-voltage swing, low-speed and low-power signal mode, or a low-voltage swing and high-speed differential signal mode. The interface circuit 3 includes a receiver 31, a common mode capacitor $C_{com}$, a terminal resistor R1, a terminal resistor R2, a switch circuit 32 and a switch control circuit 33. Under the high-speed differential mode, the terminal resistors R1 and R2 need to be coupled to the common mode capacitor $C_{com}$ to maintain signal reception integrity.

The receiver 31 has a channel 1 and a channel ch2. The channel ch1 receives a channel voltage $V_{ch1}$, and the channel ch2 receives a channel voltage $V_{ch2}$. Under the high-speed differential signal mode, the channel voltages $V_{ch1}$ and $V_{ch2}$ serve as differential signals. The switch control circuit 33 controls the switch circuit 32 according to the channel voltages $V_{ch1}$ and $V_{ch2}$ to discharge the common mode capacitor $C_{com}$ before the terminal resistor R1 or the terminal resistor R2 couples to the common mode capacitor $C_{com}$, so as to suppress noises generated at the instant when the terminal resistor R1 or the terminal resistor R2 couples to the common mode capacitor $C_{com}$.

First Embodiment

Figure 4:
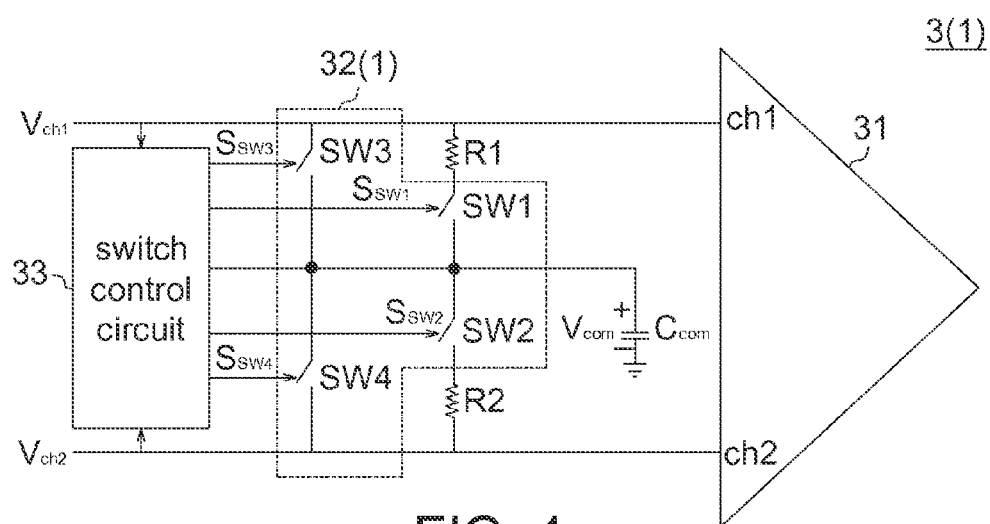
FIG. 4 is a schematic diagram of an interface circuit according to a first embodiment.
Figure 5:
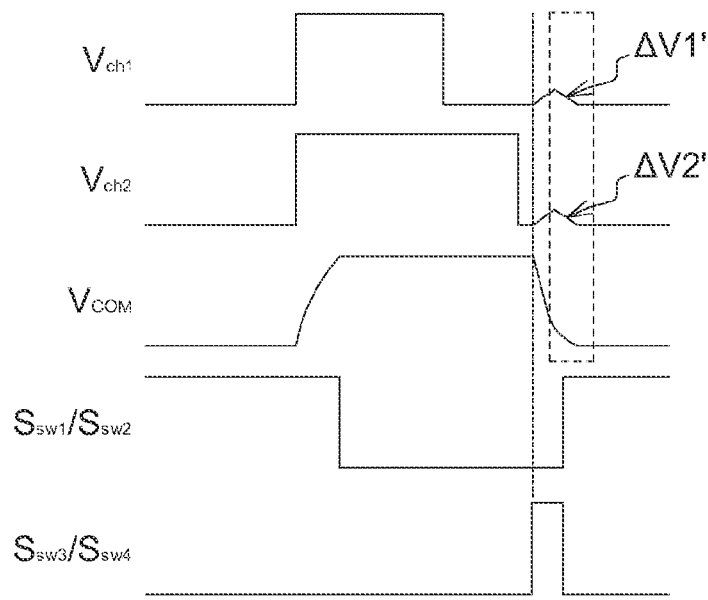
FIG. 5 is a timing diagram of associated signals according to the first embodiment

FIG. 4 shows a schematic diagram of an interface circuit according to a first embodiment; FIG. 5 shows a timing diagram of associated signals according to the first embodiment. Referring to FIGS. 4 and 5, in the first embodiment, the foregoing interface circuit 3 is exemplified by an interface circuit (3)1, and the switch circuit 32 is exemplified by a switch circuit 32(1). The switch circuit 32(1) includes switches SW1 to SW4. For example, internal resistance of the switch SW3 is greater than that of the switch SW1, and internal resistance of the switch SW4 is greater than that of the switch SW2. The switch SW1 is coupled to the terminal resistor R1 and the common mode capacitor $C_{com}$, and the switch SW2 is coupled to the terminal resistor R2 and the common mode capacitor $C_{com}$. The switch SW3 provides a discharge path between the common mode capacitor $C_{com}$ and the channel ch1, and the switch SW4 provides another discharge path between the common mode capacitor $C_{com}$ and the channel ch2.

The switch control circuit 33 generates switch control signals $S_{SW1}$ to $S_{SW4}$ according to channel voltages $V_{ch1}$ and $V_{ch2}$, and the switches SW1 to SW4 are respectively controlled by the switch control signals $S_{SW1}$ to $S_{SW4}$ The switch control circuit 33 controls the switches SW3 and SW4 to turn on before the switches SW1 and SW2 are turned on. As such, before the switches SW1 and SW2 are turned on, the common mode capacitor $C_{com}$ is discharged via the switches SW3 and SW4, so that a common mode voltage $V_{com}$ accordingly lowers. Thus, noises $\Delta V1'$ and $\Delta V2'$ produced at the channels ch1 and ch2 at the instant when the switches SW1 and SW2 are turned on can be suppressed.

Second Embodiment

Figure 6:
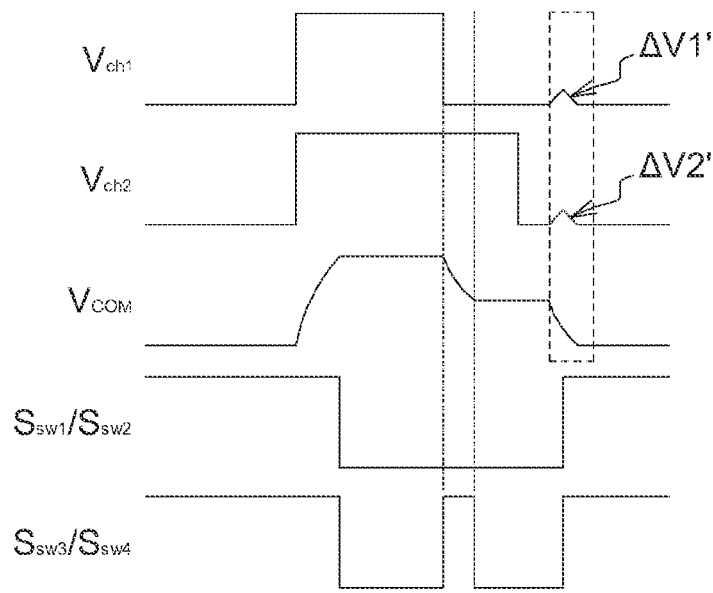
FIG. 6 is a timing diagram of associated signals according to a second embodiment.

FIG. 6 shows a timing diagram of associated signals according to a second embodiment. Referring to FIGS. 4 and 6, a difference of the second embodiment from the first embodiment is that, the switch control signals $S_{SW3}$ and $S_{SW4}$ for controlling conduction states of the switches SW3 and SW4 are different from those in the first embodiment. In the second embodiment, after the channel voltage $V_{ch1}$ changes from a high potential to a low potential and before the channel voltage $V_{ch2}$ changes from a high potential to a low potential, the switch control circuit 33 controls the switches SW3 and SW4 to turn on. Accordingly, the common mode capacitor $C_{com}$ according to the second embodiment is allowed to discharge earlier than that according to the first embodiment.

Third Embodiment

Figure 7:
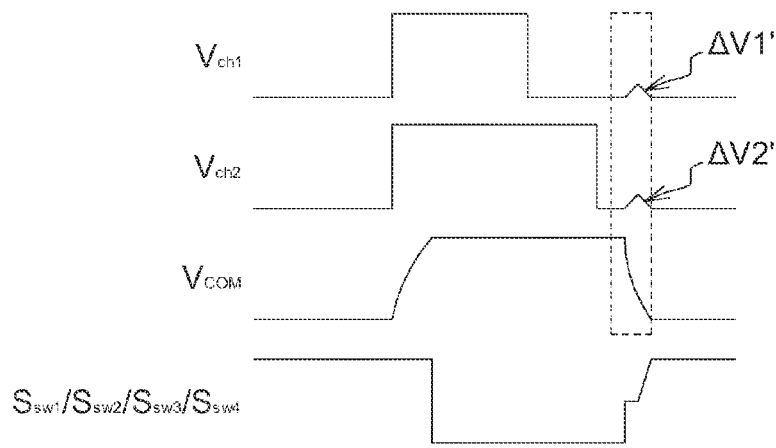
FIG. 7 is a timing diagram of associated signals according to a third embodiment.

FIG. 7 shows a timing diagram of associated signals according to a third embodiment. Referring to FIGS. 4 and 7, a difference of the third embodiment from the first embodiment is that, the switch control signals $S_{SW1}$ to $S_{SW4}$ for controlling conduction states of the switches SW1 to SW4 are different from those in the first embodiment. Before the switches SW1 to SW4 are completely turned on, the switch control circuit 33 respectively controls the switches SW1 to SW4 to be partially turned on. In other words, the switch control circuit 33 controls the turn-on or turn-off speed of the switches SW1 to SW4 through the switch control signals $S_{SW1}$ to $S_{SW4}$, so as to sectionally turn on or turn off the switches SW1 to SW4.

Fourth Embodiment

Figure 8:
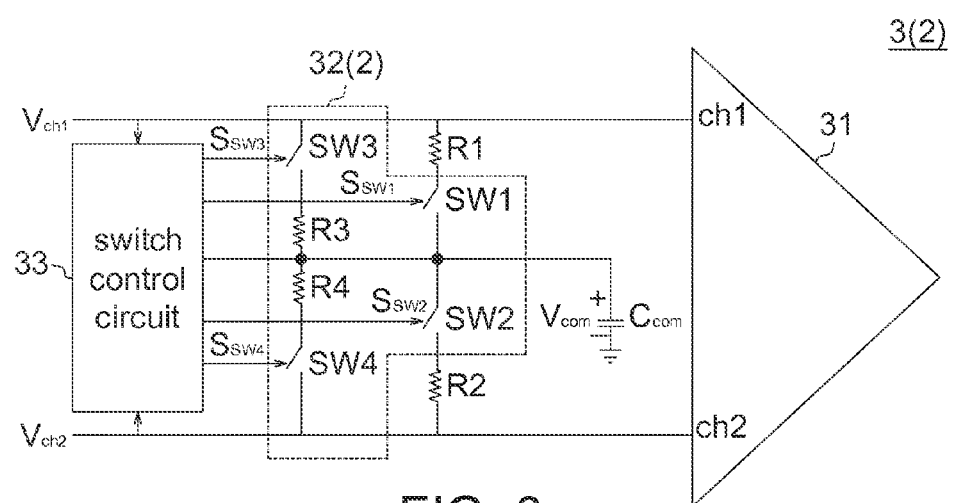
FIG. 8 is a schematic diagram of an interface circuit according to a fourth embodiment.

FIG. 8 shows a schematic diagram of an interface circuit according to a fourth embodiment. In the fourth embodiment, the foregoing interface circuit 3 is exemplified by the interface circuit 3(2), and the switch circuit 32 is exemplified by the switch circuit 32(2). A main difference of the fourth embodiment from the first embodiment is that, the switch circuit 32(2) further includes resistors R3 and R4 in the fourth embodiment. The common mode capacitor $C_{com}$ is coupled to the switch SW3 via the resistor R3, and is coupled to the switch SW4 via the resistor R4.

Fifth Embodiment

Figure 9:
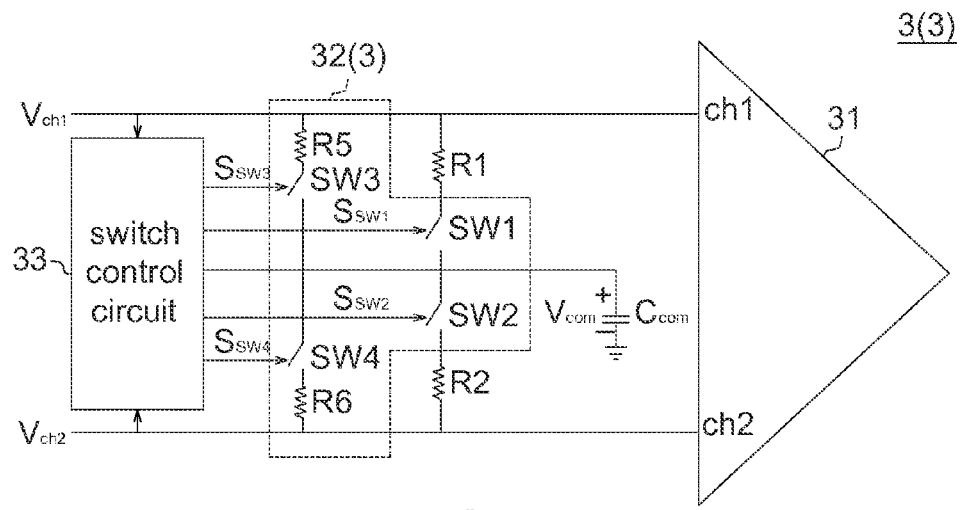
FIG. 9 is a schematic diagram of an interface circuit according to a fifth embodiment.

FIG. 9 shows a schematic diagram of an interface circuit according to a fifth embodiment. In the fifth embodiment, the foregoing interface circuit 3 is exemplified by the interface circuit 3(3), and the switch circuit 32 is exemplified by the switch circuit 32(3). A main difference of the fifth embodiment from the first embodiment is that, the switch circuit 32(3) further includes resistors R5 and R6 in the fifth embodiment. The common mode capacitor $C_{com}$ is coupled to the switch SW5 via the resistor R5, and is coupled to the switch SW6 via the resistor R6.

Sixth Embodiment

Figure 10:
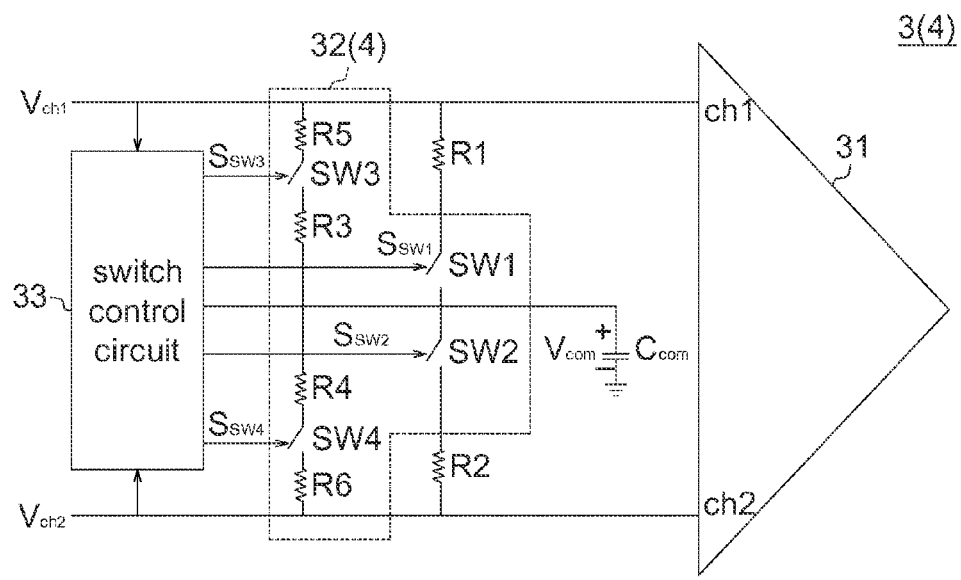
FIG. 10 is a schematic diagram of an interface circuit according to a sixth embodiment.

FIG. 10 shows a schematic diagram of an interface circuit according to a sixth embodiment. In the sixth embodiment, the foregoing interface circuit 3 is exemplified by the interface circuit 3(4), and the switch circuit 32 is exemplified by the switch circuit 32(4). A main difference of the sixth embodiment from the first embodiment is that, the switch circuit 32(4) further includes resistors R5 and R6 in the sixth embodiment. The switch SW3 is coupled to the channel ch1 via the resistor R5, and the switch SW4 is coupled to the channel ch2 via the resistor R6.

Seventh Embodiment

Figure 11:
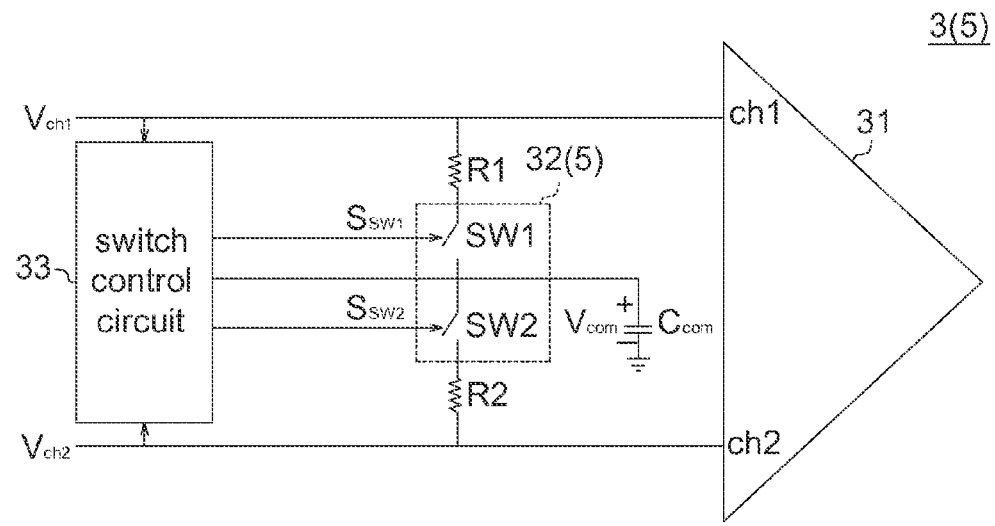
FIG. 11 is a schematic diagram of an interface circuit according to a seventh embodiment.
Figure 12:
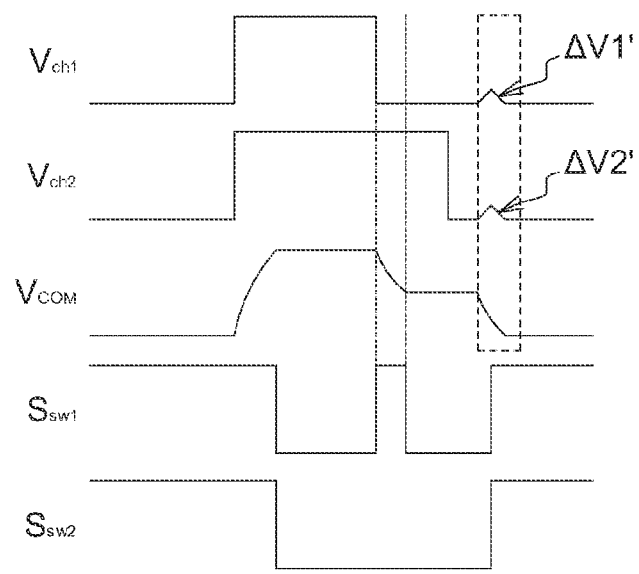
FIG. 12 is a timing diagram of associated signals according to the seventh embodiment.

FIG. 11 shows a schematic diagram of an interface circuit according to a seventh embodiment; FIG. 12 shows a timing diagram of associated signals according to the seventh embodiment. Referring to FIGS. 11 and 12, in the seventh embodiment, the foregoing interface circuit 3 is exemplified by the interface circuit 3(5), and the switch circuit 32 is exemplified by the switch circuit 32(5). The switch circuit 32(5) includes switches SW1 and SW2. The switches SW1 and SW2 are respectively controlled by the switch control signals $S_{SW1}$ and $S_{SW2}$ generate by the switch control circuit 33 according to the channel voltages $V_{ch1}$ and $V_{ch2}$. The switch SW1 is coupled to the terminal resistor R1 and the common mode capacitor $C_{com}$, and the switch SW2 is coupled to the terminal resistor R2 and the common mode capacitor $C_{com}$. The switch control circuit 33 controls the switch SW1 to turn on before the switch SW2 is turned on.

In an alternative embodiment, the switch control circuit 33 respectively controls the switches SW1 and SW2 to be partially turned on before the switches SW1 and SW2 are completely turned on. In other words, the switch control circuit 33 controls the turn-on or turn-off speed of the switches SW1 and SW2 through the switch control signals $S_{SW1}$ and $S_{SW2}$, so as to sectionally turn on or turn off the switches SW1 and SW2.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An interface circuit, comprising:
   a receiver, comprising;
      a first channel, for receiving a first channel voltage; and
      a second channel, for receiving a second channel voltage;
   a common mode capacitor;
   a first terminal resistor;
   a second terminal resistor;
   a switch circuit; and
   a switch control circuit, for controlling the switch circuit to discharge the common mode capacitor according to the first channel voltage and the second channel voltage before the first terminal resistor or the second terminal resistor couples to the common mode capacitor.

2. The interface circuit according to claim 1, wherein the switch circuit comprises:
   a first switch, for coupling the first terminal resistor and the common mode capacitor;
   a second switch, for coupling the second terminal resistor and the common mode capacitor;
   a third switch, for providing a first discharge path between the common mode capacitor and the first channel; and
   a fourth switch for providing a second discharge path between the common mode capacitor and the second channel.

3. The interface circuit according to claim 2, wherein the switch control circuit controls the third switch and the fourth switch to turn on before the first switch and the second switch are turned on.

4. The interface circuit according to claim 2, wherein the switch control circuit controls the third switch and the fourth switch to turn on after the first channel voltage changes from a high potential to a low potential and before the second channel voltage changes from a high potential to a low potential.

5. The interface circuit according to claim 2, wherein the switch control circuit respectively controls the first switch, the second switch, the third switch and the fourth switch to partially turn on before the first switch, the second switch, the third switch and the fourth switch are completely turned on.

6. The interface circuit according to claim 2, wherein internal resistance of the third switch is greater than that of the first switch, and the internal resistance of the fourth switch is greater than that of the second switch.

7. The interface circuit according to claim 2, wherein the switch circuit further comprises:
   a first resistor, via which the common mode capacitor is coupled to the third switch; and
   a second resistor, via which the common mode capacitor is coupled to the fourth switch.

8. The interface circuit according to claim 7, wherein the switch circuit further comprises:
   a third resistor, via which the third switch is coupled to the first channel; and
   a fourth resistor, via which the fourth switch is coupled to the second channel.

9. The interface circuit according to claim 2, wherein the switch circuit further comprises:
   a first resistor, coupled the common mode capacitor via the third switch; and
   a second resistor, coupled to the common mode capacitor via the fourth switch.

10. The interface circuit according to claim 1, wherein the switch circuit further comprises:
    a first switch, for coupling the first terminal resistor to the common mode capacitor; and
    a second switch, for coupling the second terminal resistor to the common mode capacitor; and
    the switch control circuit controls the first switch to turn on before the second switch is turned on.

11. The interface circuit according to claim 10, wherein the switch control circuit respectively controls the first switch and the second switch to partially turn on before the first switch and the second switch are completely turned on.

* * * * *